(12) United States Patent
Hershberger et al.

(10) Patent No.: US 8,649,179 B2
(45) Date of Patent: Feb. 11, 2014

(54) CIRCUIT ASSEMBLIES INCLUDING THERMOELECTRIC MODULES

(75) Inventors: Jeffrey Gerard Hershberger, Shaker Heights, OH (US); Richard F. Hill, Parkman, OH (US); Robert Michael Smythe, Ewing, NJ (US); Michael G. Sutsko, Avon Lake, OH (US)

(73) Assignee: Laird Technologies, Inc., Earth City, MO (US)

( * ) Notice: Subject to any disclaimer, the term of this patent is extended or adjusted under 35 U.S.C. 154(b) by 381 days.

(21) Appl. No.: 13/021,735

(22) Filed: Feb. 5, 2011

(65) Prior Publication Data

US 2012/0201008 A1    Aug. 9, 2012

(51) Int. Cl.
*H05K 7/20* (2006.01)

(52) U.S. Cl.
USPC .............. 361/712; 361/719; 361/760; 62/3.2; 62/3.7; 136/204

(58) Field of Classification Search
USPC ............ 361/676, 679.46, 704–722, 760–762
See application file for complete search history.

(56) References Cited

U.S. PATENT DOCUMENTS

| | | |
|---|---|---|
| 808,086 A | 12/1905 | Heil |
| 3,132,688 A | 5/1964 | Nowak |
| 4,935,864 A | 6/1990 | Schmidt et al. |
| 5,040,381 A | 8/1991 | Hazen |
| 5,409,547 A | 4/1995 | Watanabe et al. |
| 5,430,322 A | 7/1995 | Koyanagi et al. |
| 5,441,576 A | 8/1995 | Bierschenk et al. |
| 5,457,342 A | 10/1995 | Herbst, II |
| 5,637,921 A * | 6/1997 | Burward-Hoy ............... 257/712 |
| 5,653,741 A | 8/1997 | Grant |
| 5,921,087 A * | 7/1999 | Bhatia et al. ..................... 62/3.2 |
| 5,950,067 A | 9/1999 | Maegawa et al. |
| 6,005,182 A | 12/1999 | Imanishi et al. |

(Continued)

FOREIGN PATENT DOCUMENTS

| | | |
|---|---|---|
| CN | 1766406 | 5/2006 |
| CN | 101030612 | 9/2007 |

(Continued)

OTHER PUBLICATIONS

International Search Report and Written Opinion dated Aug. 7, 2012 from pending International PCT application No. PCT/US2012/021641 (now published as WO 2012/106111) which claims priority to the instant application; 9 pages.

(Continued)

*Primary Examiner* — Courtney Smith
(74) *Attorney, Agent, or Firm* — Harness, Dickey & Pierce, P.L.C.

(57) ABSTRACT

A circuit assembly generally includes a circuit board and at least one electrical pathway configured to couple a thermoelectric module to the circuit board for use as a heat pump in the circuit assembly. The circuit board and the at least one electrical pathway form part of the thermoelectric module when the thermoelectric module is coupled to the circuit board via the at least one electrical pathway. The thermoelectric module, including the portion of the circuit board forming part of the thermoelectric module, defines a footprint that is smaller than a footprint of the circuit board. As such, the circuit board is capable of supporting electrical components on the circuit board in a position outside the footprint defined by the thermoelectric module.

26 Claims, 6 Drawing Sheets

(56) References Cited

U.S. PATENT DOCUMENTS

| | | | |
|---|---|---|---|
| 6,054,676 A | 4/2000 | Wall et al. | |
| 6,094,919 A | 8/2000 | Bhatia | |
| 6,196,002 B1* | 3/2001 | Newman et al. | 62/3.7 |
| 6,226,994 B1 | 5/2001 | Yamada et al. | |
| 6,274,803 B1 | 8/2001 | Yoshioka et al. | |
| 6,327,149 B1* | 12/2001 | Goenka | 361/720 |
| 6,385,976 B1 | 5/2002 | Yamamura et al. | |
| 6,410,971 B1 | 6/2002 | Otey | |
| 6,539,725 B2 | 4/2003 | Bell | |
| 6,700,052 B2 | 3/2004 | Bell | |
| 6,711,904 B1 | 3/2004 | Law et al. | |
| 6,815,814 B2 | 11/2004 | Chu et al. | |
| 7,032,389 B2 | 4/2006 | Cauchy | |
| 7,284,379 B2 | 10/2007 | Pham et al. | |
| 7,299,639 B2 | 11/2007 | Leija et al. | |
| 7,587,902 B2 | 9/2009 | Bell | |
| 7,765,811 B2 | 8/2010 | Hershberger et al. | |
| 7,855,397 B2 | 12/2010 | Alley et al. | |
| 2002/0164475 A1 | 11/2002 | Imamura et al. | |
| 2003/0043868 A1 | 3/2003 | Stewart et al. | |
| 2003/0179548 A1* | 9/2003 | Becker et al. | 361/704 |
| 2005/0254013 A1 | 11/2005 | Engle et al. | |
| 2006/0266404 A1 | 11/2006 | Hiller et al. | |
| 2008/0298069 A1 | 12/2008 | Chu | |
| 2009/0072385 A1* | 3/2009 | Alley et al. | 257/713 |
| 2009/0153007 A1 | 6/2009 | Jiang | |
| 2009/0154175 A1 | 6/2009 | Lai et al. | |
| 2009/0168429 A1 | 7/2009 | Huang et al. | |
| 2009/0179323 A1 | 7/2009 | Feng et al. | |
| 2009/0205696 A1* | 8/2009 | Koester et al. | 136/201 |
| 2009/0207606 A1 | 8/2009 | Tsao et al. | |
| 2009/0225556 A1 | 9/2009 | Hsu et al. | |
| 2010/0124058 A1 | 5/2010 | Miller | |
| 2010/0281884 A1 | 11/2010 | Rawski et al. | |
| 2011/0000516 A1 | 1/2011 | Hershberger et al. | |
| 2011/0030754 A1 | 2/2011 | Smythe et al. | |
| 2012/0162947 A1* | 6/2012 | O'Donnell et al. | 361/783 |

FOREIGN PATENT DOCUMENTS

| | | |
|---|---|---|
| CN | 201152650 | 11/2008 |
| CN | 101533887 | 9/2009 |
| CN | 101688707 | 3/2010 |
| EP | 2174077 | 4/2010 |
| JP | 09-135859 | 5/1997 |
| JP | 11-177154 | 7/1999 |
| JP | 11-257789 | 9/1999 |
| JP | 2003-258323 | 9/2003 |
| JP | 2004-079883 | 3/2004 |
| JP | 2006-049872 | 2/2006 |
| JP | 2006-135124 | 5/2006 |
| JP | 2006-294783 | 10/2006 |
| JP | 2006-319119 | 11/2006 |
| JP | 2007-258298 | 10/2007 |
| JP | 2008-141027 | 6/2008 |
| JP | 2010-532577 | 10/2010 |
| KR | 1020000019706 | 4/2000 |
| KR | 100756535 | 8/2007 |
| TW | 200613685 | 5/2006 |
| WO | WO 94/19833 | 9/1994 |
| WO | WO 2008/117324 | 10/2008 |
| WO | WO 2009/005899 | 1/2009 |
| WO | WO2010-093449 | 8/2010 |
| WO | WO2012/106111 | 8/2012 |

OTHER PUBLICATIONS

Written Opinion and International Search Report dated Sep. 28, 2010, issued by the International Search Authority for International Patent Application No. PCT/US2010/025806, 11 pages.

Supplementary European Search Report dated Aug. 23, 2010, for European Patent Application No. EP 08 755521 which is not related through a priority claim but includes a common assignee, 8 pages.

Office Action issued by the Office of the State Intellectual Property of China, dated Aug. 4, 2010, for Chinese Patent Application No. 200880022520.5, 8 pages.

Laird Technologies, "T-Lam System Design Guide, Part One: Performance and Reliability", 2009, 20 pages.

Laird Technologies, "T-Lam System Design Guide, Part Two: Manufacturability", 2009, 20 pages.

* cited by examiner

CIRCUIT ASSEMBLIES INCLUDING THERMOELECTRIC MODULES

FIELD

The present disclosure generally relates to circuit assemblies, and more particularly to circuit assemblies including thermoelectric modules and methods of making the same.

BACKGROUND

This section provides background information related to the present disclosure which is not necessarily prior art.

A thermoelectric module (TEM) is a solid state device that can operate as a heat pump or as an electrical power generator. When a thermoelectric module is used as a heat pump, the thermoelectric module utilizes the Peltier effect to move heat. When a thermoelectric module is used to generate electricity, the thermoelectric module may be referred to as a thermoelectric generator (TEG). The TEG may be electrically connected to a power storage circuit, such as a battery charger, etc. for storing electricity generated by the TEG.

With regard to use of a thermoelectric module to move heat, and by way of general background, the Peltier effect refers to the transport of heat that occurs when electrical current passes through a thermoelectric material. Heat is either picked up where electrons enter the material and is deposited where electrons exit the material (as is the case in an N-type thermoelectric material), or heat is deposited where electrons enter the material and is picked up where electrons exit the material (as is the case in a P-type thermoelectric material). As an example, bismuth telluride may be used as a semiconductor material. Here, the thermoelectric module is usually constructed by connecting alternating N-type and P-type elements of thermoelectric material ("elements") electrically in series and mechanically fixing them between two circuit boards, typically constructed from aluminum oxide. The use of an alternating arrangement of N-type and P-type elements causes electricity to flow in one spatial direction in all N-type elements and in the opposite spatial direction in all P-type elements. As a result, when connected to a direct current power source, electrical current causes heat to move from one side of the thermoelectric module to the other (e.g., from one circuit board to the other circuit board, etc.). Naturally, this warms one side of the thermoelectric module and cools the other side. A typical application exposes the cooler side of the thermoelectric module to an object, substance, or environment to be cooled.

SUMMARY

This section provides a general summary of the disclosure, and is not a comprehensive disclosure of its full scope or all of its features.

Example embodiments of the present disclosure generally relate to circuit assemblies. In one example embodiment, a circuit assembly includes a circuit board and at least one electrical pathway configured to couple a thermoelectric module to the circuit board for use as a heat pump in the circuit assembly. The at least one electrical pathway forms part of the thermoelectric module when the thermoelectric module is coupled to the circuit board. And, the circuit board is configured to support electrical components on the circuit board at locations spaced apart from the at least one electrical pathway.

Example embodiments of the present disclosure generally relate to thermoelectric modules for use in circuit assemblies. In one example embodiment, a thermoelectric module includes a first substrate, a second substrate disposed within a footprint of the first substrate, and thermoelectric elements disposed generally between the first and second substrates. The first substrate is defined by a portion of a circuit board, the circuit board being configured to support at least one electrical component in a position spaced apart from the thermoelectric module. The thermoelectric module is operable as a heat pump.

Example embodiments of the present disclosure also generally relate to methods of making circuit assemblies having circuits and thermoelectric modules incorporated therein. In one example embodiment, a method of making a circuit assembly includes forming at least one electrical pathway on a circuit board as part of the circuit and coupling multiple thermoelectric elements between part of the circuit board and a substrate, thereby forming a thermoelectric module on the circuit board such that the circuit board defines part of the thermoelectric module. The at least one electrical pathway is configured to electrically couple an electrical component of the circuit to the circuit board. And, the substrate defines a footprint that is smaller than a footprint of the circuit board whereby the circuit board is configured to support electrical components of the circuit on the circuit board in a position outside the footprint defined by the substrate.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
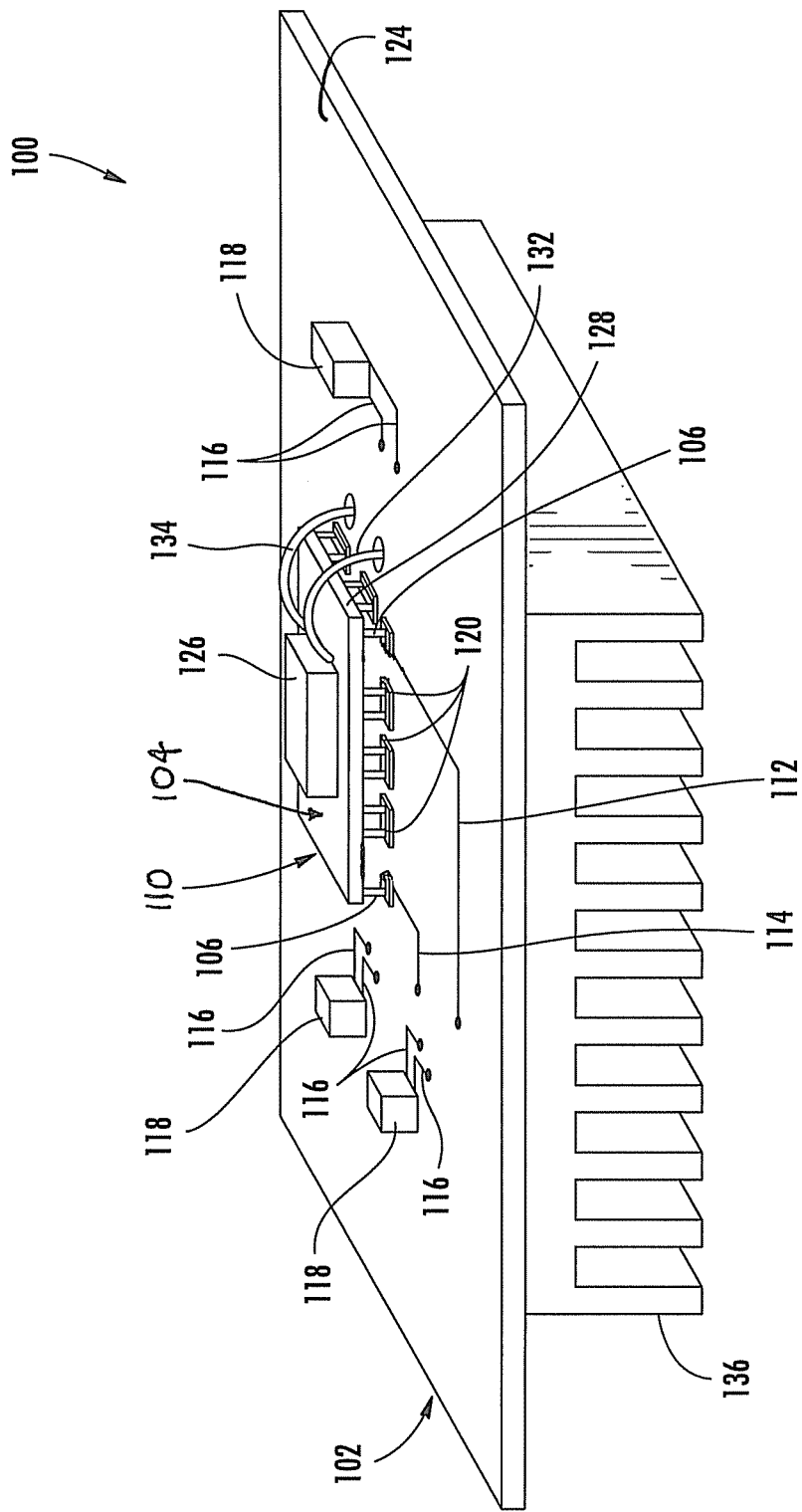
FIG. 1 is a perspective view of a circuit assembly according to an example embodiment of the present disclosure.

Example embodiments of the present disclosure generally relate to circuit assemblies suitable for use in electrical devices such as, for example, computers, air conditioners, etc.

The circuit assemblies include circuit boards (broadly, substrates) configured to support circuits and electronic components associated therewith, along with thermoelectric modules. In some example embodiments, the thermoelectric modules operate to help control (e.g., warm, cool, maintain, etc.) temperatures of the circuit boards and/or of at least one of the electrical components supported on the circuit boards as desired (e.g., to help maintain proper operating temperatures of the circuit boards and/or the electrical components thereon, etc.). In some example embodiments, the thermoelectric modules operate to help control (e.g., warm, cool, maintain, etc.) temperatures of environments (e.g., air, other structures, plates, etc.) generally around the circuit assemblies (e.g., of electrical devices in which the circuit assemblies are included, etc.) as desired (e.g., to help maintain proper operating temperatures of the environments, etc.).

In some example embodiments, circuit assemblies include circuit boards configured to support circuits and electronic components associated therewith, along with thermoelectric modules configured to control temperatures of (e.g., transfer heat away from, cool, etc.) desired parts of the circuits (e.g., specific heat-producing ones of the electronic components of the circuits, specific other ones of the electronic components of the circuits, etc.). With this configuration, a portion of the circuit boards form part of the thermoelectric modules such that the circuits and the thermoelectric modules are located together on the same circuit boards, thereby allowing for integration (e.g., mechanical integration, thermal integration, electrical integration, combinations thereof, etc.) of the thermoelectric modules into the circuits. The thermoelectric modules are then operable to control temperatures of the desired parts of the circuit. In particular, the circuit boards directly function as either hot sides of the thermoelectric modules or cold sides of the thermoelectric modules for use in controlling temperatures of the desired parts of the circuit. The thermoelectric modules may also, in some example embodiments, be used as electrical power generators in the circuit assemblies.

In some example embodiments, circuit assemblies include circuit boards configured to support circuits and electronic components associated therewith, along with thermoelectric modules configured to transfer heat across the circuit boards (e.g., from one side of the circuit boards to an opposite side of the circuit boards, etc.).

In some example embodiments, circuits (e.g., electrical pathways, electrical components, etc.) located on the same circuit boards as thermoelectric modules are configured to help control operations of the thermoelectric modules (e.g., as part of thermoelectric module circuits, etc.). Lead wires can be coupled to the circuit boards to provide power to the circuits, or power supplies may be mounted on the circuit boards (as part of the circuits) together with the thermoelectric modules to provide power thereto.

In some example embodiments circuits (e.g., electrical pathways, electrical components, etc.) located on the same circuit boards as thermoelectric modules define circuits that are separate from (e.g., electrically independent from, etc.) the thermoelectric modules, and that are configured to perform desired operations independent of the thermoelectric modules. Such example circuits can include integrated circuits, etc. And, example electrical components associated with such circuits can include power supplies, lights, switches, amplifiers, etc. Various parts of the these circuits (e.g., electrical components thereof, etc.) may have heat-producing tendencies such that the thermoelectric modules are then used to help control temperatures of the circuits as desired.

In some example embodiments, multiple thermoelectric modules are located together on the same circuit boards. In some of these embodiments, circuits located on the same circuit boards as the thermoelectric modules are configured to help control operations of the thermoelectric modules (e.g., of individual ones of the thermoelectric modules, of the multiple thermoelectric modules together as a group, etc.). In other ones of these embodiments, circuits located on the same circuit boards as the thermoelectric modules define circuits that are separate from (e.g., electrically independent from, etc.) the thermoelectric modules, and that are configured to perform desired operations independent of the thermoelectric modules.

In some example embodiments, circuits have electrical pathways (e.g., electrical tracks, signal traces, current-carrying paths, bus bars, etc.) formed (e.g., etched, milled, soldered, laminated, etc.) on electrically non-conductive surfaces of circuit boards in desired patterns. The electrical pathways can be formed by desired operations including, for example, etching operations, milling operations, soldering operations, etc. The electrical pathways operate to electrically couple electronic components of the circuits together for desired operations. The electrical pathways can be disposed on one side portion of the circuit boards, on both side portions of the circuit boards, and/or buried in the circuit boards. In example embodiments where the current-carrying pathways are disposed on only one side portion of the circuit boards, opposing side portions of the circuit boards are generally featureless and can further include metal backing plates (e.g., aluminum plates, etc.) to provide additional support to the circuit boards and/or to provide thermally conductive characteristics that can serve to transfer heat between the circuit boards and other components and/or surrounding environments.

In some example embodiments, circuit boards are prefabricated circuit boards (e.g., Tlam circuit boards from Laird Technologies (St. Louis, Mo.), etc.) having, for example, alternating layers of dielectric material and electrically conductive material formed (e.g., laminated, pressed, etc.) on metal backing plates. The layers of dielectric material can be constructed from suitable electrically insulating material such as, for example, polymeric material (e.g., cured resin, cured resin with thermally conductive filler particles (e.g., fiberglass, ceramics, etc.) added thereto, cured ceramic-filled material, mechanically reinforced fiberglass material, etc.), etc. The layers of electrically conductive material can be constructed from any suitable conducting metallic material such as, for example, copper, nickel, aluminum, stainless steel, combinations thereof, etc. And, any suitable thickness of metallic material may be used (e.g., six-ounce copper foil, etc.), depending, for example, on desired current capacity, etc. Electrical pathways can then be formed on the layers of dielectric material, for example, by removing (e.g., etching, cutting (e.g., milled, water jet cut, eroded, etc.), etc.) part of the layers of electrically conductive material in desired patterns. The resulting electrical pathways may be located on outer surfaces of the circuit boards and/or buried within the circuit boards (between layers of dielectric material where the circuit boards include multiple layers of dielectric material). In some of these embodiments, electrical pathways may be constructed, as desired, between different layers by the use of vias. In some of these embodiments, the circuit boards may be formed from thermally conductive materials to help improve thermally conductive properties of the circuit boards. In addition, thermal vias may be included to help with desired thermal conductivity. Additional examples are described in co-owned U.S. patent application Ser. No. 12/560,194, filed Sep.

15, 2009, and titled "Thermoelectric Modules and Related Methods," the entire disclosure of which is incorporated herein by reference.

In other example embodiments, circuit boards have traditional circuit board constructions such as, for example, ceramic constructions, fiberglass reinforced epoxy constructions, etc. with electrical pathways formed thereon, for example, by soldering conductive traces, etc. to the circuit boards in desired patterns. In some of these embodiments, the circuit boards may include thermally conductive materials to help improve thermally conductive properties of the circuit boards.

In some example embodiments, thermoelectric modules include N-type and P-type thermoelectric elements disposed between two spaced apart circuit boards. Electrical pathways (e.g., patterns of electrically conductive material, etc.) are provided on inner side portions of the circuit boards to electrically couple adjacent thermoelectric elements together for operation. The N-type and P-type elements can be formed from any suitable materials (e.g., bismuth telluride, etc.) and can have any desired shapes (e.g., cubic, etc.). And, the N-type and P-type thermoelectric elements can be arranged in configurations such as, for example, alternating configurations of N-type and P-type thermoelectric elements, series configurations of N-type and P-type thermoelectric elements, etc. In addition, the thermoelectric modules can be located on the circuit boards in any desired positions. For example, the thermoelectric modules can be located toward generally center portions of circuit boards, toward generally off-center portions of circuit boards, or toward any other portions of circuit boards as desired.

In some example embodiments, heat transfer devices are used to help transfer heat to/from circuit boards. Example heat transfer devices can include heat sinks, heat spreaders, heat pipes, heat plates, fans, combinations thereof, etc. Thermal interface materials may be used between the heat transfer devices and the circuit boards to fill any gaps therebetween, in order to increase thermal transfer efficiency between the circuit boards and the heat transfer devices (as compared to having the gaps filled with air, which is a relatively poor thermal conductor).

Example embodiments will now be described more fully with reference to the accompanying drawings.

FIG. 1 illustrates an example embodiment of a circuit assembly 100 of the present disclosure. The circuit assembly 100 includes two spaced apart circuit boards 102 and 104. Thermoelectric elements 106 (e.g., alternating N-type and P-type thermoelectric elements, etc.) are disposed between a portion of circuit board 102 and circuit board 104. Together, the portion of circuit board 102, the thermoelectric elements 106, and circuit board 104 define a thermoelectric module 110 (TEM). A positive electrical pathway 112 and a negative electrical pathway 114 are formed along circuit board 102 to provide power to the TEM 110, and thereby define a TEM circuit generally on circuit board 102. In the illustrated embodiment the TEM 110 functions as a heat pump, with circuit board 104 operating as a cold side of the TEM 110 and circuit board 102 operating as a hot side of the TEM 110.

Circuit board 102 is larger in size than circuit board 104 such that the TEM 110 is located within a footprint defined by circuit board 102. This provides room to form the positive electrical pathway 112 and the negative electrical pathway 114 of the TEM circuit on circuit board 102 adjacent the TEM 110. This also provides room to form additional electrical pathways 116 and position additional electrical components 118, as desired, on circuit board 102 generally around the TEM 110 (and, for example, outside a footprint defined by the TEM 110 and circuit board 104).

Circuit board 102 is a one-sided circuit board. As such, the electrical pathways 116 (and the electrical components 118 associated therewith) are disposed on only one side of circuit board 102—an upper side portion (as viewed in FIG. 1). Similarly, electrically conductive patterns 120 (e.g., bus bars, etc.) for coupling the thermoelectric elements 106 of the TEM 110 to circuit board 102 (and for electrically coupling adjacent thermoelectric elements 106 together as part of the hot side of the TEM 110) are formed on only the upper side portion of circuit board 102 (such that the TEM 110 is located on the upper side portion of circuit board 102). In addition, circuit board 102 has a layered structure that includes the electrical pathways 116 and electrically conductive patterns 120 formed on a base 124. In particular, the electrical pathways 116 and the electrically conductive patterns 120 are formed by removing part of a conductive layer (which is coupled to (e.g., laminated to, pressed to, etc.) the base 124) from the base 124 in a desired pattern, thereby leaving the electrical pathways 116 and the electrically conductive patterns 120 on the base 124. As an example, the base 124 may include a solid dielectric layer. And as another example, the base 124 may include a dielectric layer supported on a thermally conductive support layer (with the electrical pathways 116 then formed on the dielectric layer).

Circuit board 104 is a two-sided circuit board. An electrical pathway (not visible) configured to accommodate an electrical component 126 (e.g., a heat-producing electrical component, etc.) is formed on an upper side portion of circuit board 104. And, electrically conductive patterns (not visible) for coupling the thermoelectric elements 106 of the TEM 110 to circuit board 104 (and for electrically coupling adjacent thermoelectric elements 106 together as part of the cold side of the TEM 110) are formed on a lower side portion of circuit board 104. Circuit board 104 has a layered structure that includes two electrically conductive layers formed on opposite sides of a dielectric layer 128 (such that the dielectric layer 128 is disposed generally between the two conductive layers). The electrically conductive patterns for coupling the thermoelectric elements 106 to circuit board 104 are formed on the lower side portion of circuit board 104 by removing part of the conductive layer from the base 124 in a desired pattern. And similarly, the electrical pathway configured to accommodate the electrical component 126 on the upper side portion of circuit board 104 is formed by removing part of the conductive layer from the base 124 in a desired pattern.

In the illustrated embodiment, the circuit assembly 100 may be assembled generally as follows. The electrical pathways 116 and the electrically conductive patterns 120 are initially formed on circuit board 102. The TEM 110 is then formed as part of circuit board 102 by initially forming a half TEM module, and then coupling (e.g., physically coupling, electrically coupling, thermally coupling, combinations thereof, etc.) the half TEM module to circuit board 102. In particular, the half TEM module is initially formed by coupling the thermoelectric elements 106 to the electrically conductive patterns formed on the lower side portion of circuit board 104. The thermoelectric elements 106 of the half TEM module are then coupled to the electrically conductive patterns 120 formed on circuit board 102 to thereby form the TEM 110 (as an integral part of circuit board 102). Alternatively, the circuit assembly 100 could be assembled by known operations using, for example, automated surface mount technology, etc.

The electrical components 118 are coupled (e.g., physically coupled, electrically coupled, thermally coupled, combinations thereof, etc.) to circuit board 102 along desired electrical pathways 116 around the TEM 110 for operation (e.g., to provide power to the electrical components 118, etc.). And similarly, the electrical component 126 is coupled to the electrical pathway formed on the upper side surface of circuit board 104 as part of a circuit separate from (e.g., electrically independent from, etc.) the TEM circuit. In the illustrated embodiment, a positive jumper wire 132 and a negative jumper wire 134 are provided to couple the electrical component 126 to the circuit board 102 (e.g., to an electrical pathway (not shown) formed on circuit board 102, etc.) to thereby provide power to the electrical component 126 as needed. At least one or more of the illustrated additional electrical components 118 may be configured to help control operation of the TEM 110 (as part of the TEM circuit). In addition, at least one or more of the illustrated additional electrical components 118 may be part of a circuit separate from (e.g., electrically independent from, etc.) the TEM circuit and may perform other desired operations (independent of the TEM circuit).

In operation, the TEM 110 functions to help control a temperature of electrical component 126 positioned on the upper side surface of circuit board 104 by transferring heat from the electrical component 126 to circuit board 102 (via the Peltier effect). Circuit board 102 then operates as a heat spreader and a heat sink to help dissipate the transferred heat to surrounding air. In addition in the illustrated embodiment, a heat sink 136 is coupled to a lower side portion of the base 124 of circuit board 102 to further help dissipate the transferred heat away from circuit board 102 (and circuit assembly 100), to surrounding air. The heat sink 136 may be cooled by conventional convection and/or radiation techniques. And, a thermal interface material (TIM) may be used between circuit board 102 and the heat sink 136 to fill any gaps therebetween, in order to increase thermal transfer efficiency from circuit board 102 to the heat sink 136 (as compared to having the gaps filled with air, which is a relatively poor thermal conductor). In other example embodiments, heat transfer devices other than heat sinks may be used to help dissipate heat from circuit assemblies to surrounding air. And, in other example embodiments circuit boards may operate as the primary source of heat dissipation from circuit assemblies to surrounding air (such that secondary heat transfer devices (e.g., heat sinks, etc.) are not used or included).

Figure 2:
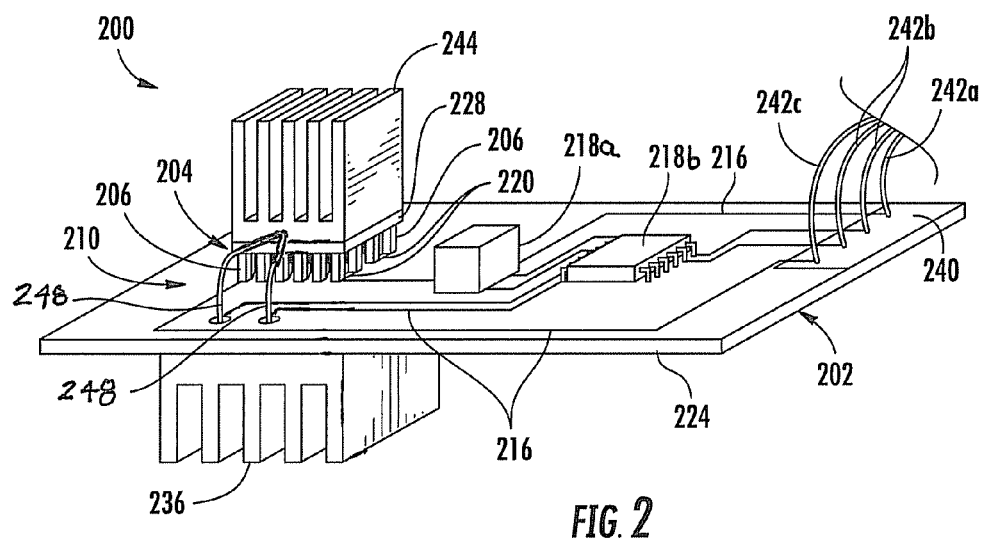
FIG. 2 is a perspective view of a circuit assembly according to another example embodiment of the present disclosure.
Figure 3:
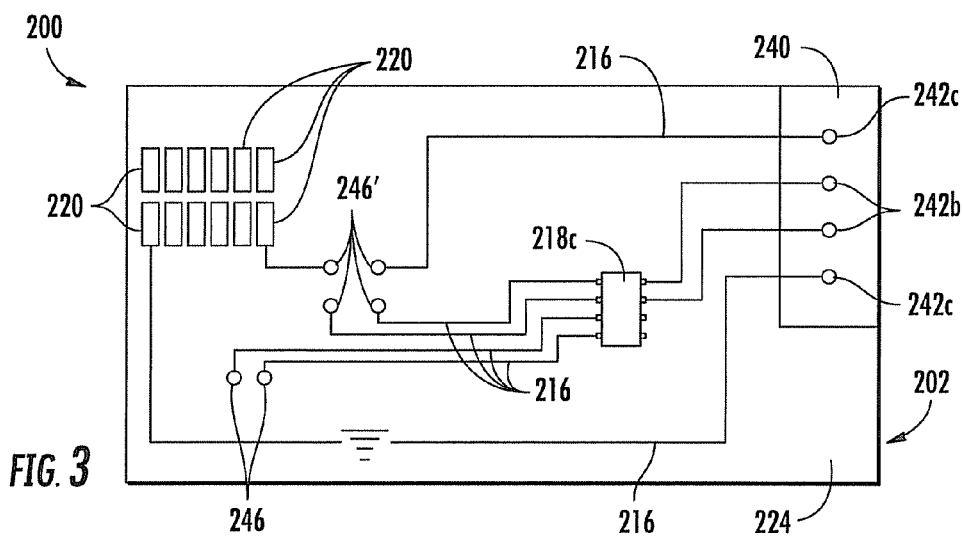
FIG. 3 is a top plan view of the circuit assembly of FIG. 2 with electronic components removed from the circuit assembly to help illustrate additional details thereof.

FIGS. 2 and 3 illustrate another example embodiment of a circuit assembly 200 of the present disclosure. The circuit assembly 200 includes two spaced apart circuit boards 202 and 204. Thermoelectric elements 206 are disposed between a portion of circuit board 202 and circuit board 204. And together, that portion of circuit board 202, the thermoelectric elements 206, and circuit board 204 define a TEM 210.

In the illustrated embodiment the TEM 210 functions as a heat pump, with circuit board 202 operating as a hot side of the TEM 210 and circuit board 204 operating as a cold side of the TEM 210. Circuit board 202 also supports several additional electrical pathways 216 and electrical components 218a and 218b (at locations generally around the TEM 210) that function to help control operation of the TEM 210. For example, circuit board 202 hosts a mounting area 240 configured to receive (as shown in FIG. 2) a power supply connection 242a for the TEM 210, communications connections 242b associated with operation of the TEM 210, and a ground connection 242c for the TEM 210. Further, circuit board 202 supports a temperature control circuit (also referred to as a TEM circuit) configured to help control operation of the TEM 210. The temperature control circuit includes mounting pads 246 (FIG. 3) configured to accommodate thermocouple 248 (FIG. 2) coupled to the TEM 210, mounting pads 246' (FIG. 3) configured to accommodate a relay 218a (FIG. 2), and an application specific integrated circuit (ASIC) controller 218b in communication therewith configured to help control operation of the TEM 210. As such, in this embodiment parts of the TEM 210 (via the temperature control circuit) can be used to sense thermal conditions of the circuit assembly 200.

Circuit board 202 is larger in size than circuit board 204 such that the TEM 210 is located within a footprint defined by circuit board 202. This provides room to form the additional electrical pathways 216, the mounting area 240, and the mounting pads 246 and 246' and to position the electrical components 218a, 218b, and 248 associated with operation of the TEM 210, as desired, on circuit board 202 generally around the TEM 210 (and, for example, outside a footprint defined by the TEM 210 and circuit board 204). While not shown, it should be appreciated that at least one or more additional electrical pathways and/or components may be included on circuit board 202 as part of a circuit separate from (e.g., electrically independent from, etc.) the temperature control circuit of the TEM 210 to perform other desired operations independent of the temperature control circuit of the TEM 210.

Circuit board 202 is a one-sided circuit board. As such, the electrical pathways 216, mounting pads 246 and 246', and the electrical components 218a, 218b, and 248 associated therewith are disposed on only one side of circuit board 202—an upper side portion (as viewed in FIG. 2). Similarly, electrically conductive patterns 220 for coupling the thermoelectric elements 206 of the TEM 210 to circuit board 202 (and for electrically coupling adjacent thermoelectric elements 206 together as part of the hot side of the TEM 210) are provided on only the upper side portion of circuit board 202 (such that the TEM 210 is ultimately located on the upper side portion of circuit board 202). In addition, circuit board 202 has a layered structure that includes the electrical pathways 216 and the electrically conductive patterns 220 formed on a base 224. In particular, the electrical pathways 216 are formed by removing part of a conductive layer from the base 224 in a desired pattern, thereby leaving the electrical pathways 216 and the electrically conductive patterns 220 on the base 224. As an example, the base 224 may include a solid dielectric layer. And as another example, the base 224 may include a dielectric layer supported on a thermally conductive support layer (with the electrical pathways 216 then formed on the dielectric layer).

Circuit board 204 is also a one-sided circuit board. Here, electrically conductive patterns (not visible) for coupling the thermoelectric elements 206 of the TEM 210 to circuit board 204 (and for electrically coupling adjacent thermoelectric elements 206 together as part of the cold side of the TEM 210) are formed on only one side of circuit board 204—a lower side portion (as viewed in FIG. 2). As with circuit board 202, circuit board 204 also has a layered structure that includes an electrically conductive layer formed on a base 228. Here, the electrically conductive patterns for coupling the thermoelectric elements 206 to circuit board 204 are formed on the lower side portion of circuit board 204. The electrically conductive patterns are formed by removing part of the conductive layer from the base 228 in a desired pattern, thereby leaving the electrically conductive patterns on the base 228. As an example, the base 228 may include a solid dielectric layer. And as another example, the base 228 may include a dielectric layer supported on a thermally conductive support layer (with the electrically conductive patterns then formed on the dielectric layer of the base).

In the illustrated embodiment, the circuit assembly 200 is assembled generally as follows. The electrical pathways 216, the electrically conductive patterns 220, the mounting area 240, and the mounting pads 246 and 246' are initially formed on circuit board 202. The TEM 210 is then formed as part of circuit board 202 by initially forming a half TEM module, and then coupling the half TEM module to circuit board 202. In particular, the half TEM module is initially formed by coupling the thermoelectric elements 206 to the electrically conductive patterns formed on the lower side portion of circuit board 204. The thermoelectric elements 206 of the half TEM module are then coupled to the electrically conductive patterns 220 formed on circuit board 202 to thereby form the TEM 210 (as an integral part of circuit board 202). Alternatively, the circuit assembly 200 could be assembled by known operations using, for example, automated surface mount technology, etc.

The electrical components 218a and 218b are coupled to circuit board 202 along desired electrical pathways 216 around the TEM 210 for operation (e.g., to provide power to the electrical components 218a and 218b, etc.). In addition in the illustrated embodiment, a heat sink 244 is coupled to an upper side surface of the base 228 of circuit board 204, as part of a circuit separate from the temperature control circuit of the TEM 210. And, the thermocouple 248 is coupled to the TEM 210 and to the mounting pads 246 of the circuit board 202.

In operation of the illustrated embodiment, the heat sink 244 coupled to circuit board 204 operates to receive heat from surrounding air and transfer the received heat to circuit board 204. The TEM 210 transfers heat from the heat sink 244 and circuit board 204 to circuit board 202 (via the Peltier effect). Circuit board 202 then operates as a heat spreader and a heat sink to help dissipate the transferred heat to surrounding air. In other example embodiments, heat transfer devices other than heat sinks (e.g., heat plates, etc.) may be used to receive heat from surrounding air (e.g., depending on desired operation, etc.).

In addition in the illustrated embodiment, an additional heat sink 236 is coupled to a lower side portion of the base 224 of circuit board 202 to further help dissipate heat away from circuit board 202 (and circuit assembly 200), to surrounding air. The heat sink 236 may be cooled by conventional convection and/or radiation techniques. A TIM may be used between circuit board 202 and the heat sink 236 as well as between circuit board 204 and the heat sink 244 to fill any gaps therebetween, in order to increase thermal transfer efficiency from circuit board 202 to the heat sink 236 and from the heat sink 244 to circuit board 204 (as compared to having the gaps filled with air, which is a relatively poor thermal conductor). As such, circuit assembly 200 operates to transport heat generally from one side of circuit board 202 (from the heat sink 244 and circuit board 204) to an opposing side of circuit board 202 (and to heat sink 236).). In other example embodiments, heat transfer devices other than heat sinks may be used to help dissipate heat from circuit assemblies to surrounding air. And, in other example embodiments circuit boards may operate as the primary source of heat dissipation from circuit assemblies to surrounding air (such that secondary heat transfer devices (e.g., heat sinks, etc.) are not used or included).

As an example, circuit assembly 200 could be used as part of an air conditioning unit, where the heat sink 244 (attached to circuit board 204) operates to cool fluid (e.g., air, etc.) inside an enclosure of the air conditioning unit. And, the heat sink 236 attached to circuit board 202 (which forms a generally bottom portion of the TEM 210) operates to exhaust heat from the heat sink 244 to the ambient air.

In the illustrated embodiment, circuit assembly 200 is shown as including a single TEM 210. But it should be appreciated that circuit assembly 200 could instead include multiple TEMs as desired. In so doing, circuit board 202 would include additional electrically conductive patterns for accommodating an additional TEM or multiple additional TEM(s) (in addition to TEM 210). The additional TEM(s) would function as a heat pump(s), with circuit board 202 operating as a hot side of the TEM(s) and a second spaced apart circuit board of the additional TEM(s) operating as a cold side of the TEM(s). The multiple TEMs can be controlled together or individually by a single controller (e.g., an ASIC controller, etc.), or the multiple TEMs can be controlled individually by multiple separate controllers. Here, circuit assembly 200 could again be used as part of an air conditioning unit, where the heat sink 244 would be attached to multiple upper circuit boards (including circuit board 204) of the multiple TEMs and would operate to cool air inside an enclosure of the air conditioning unit. And, the heat sink 236 attached to circuit board 202 (which would form a generally bottom portion of the multiple TEMs) would operate to exhaust heat from the heat sink 244 to the ambient air.

Figure 4:
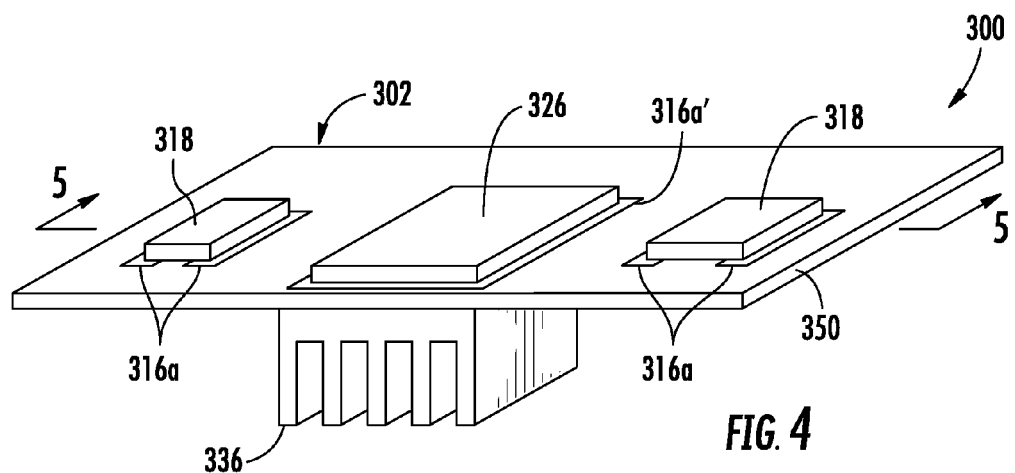
FIG. 4 is a perspective view of a circuit assembly according to still another example embodiment of the present disclosure.
Figure 5:
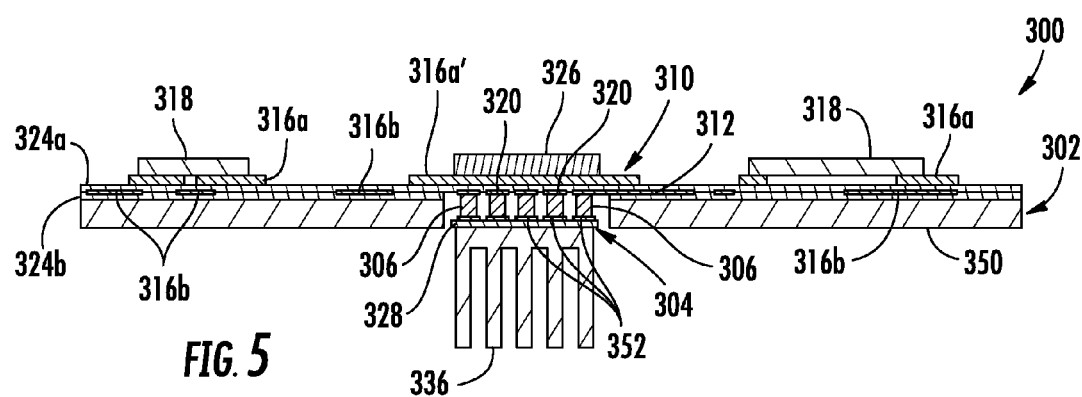
FIG. 5 is a section view of the circuit assembly of FIG. 4 taken in a plane including line 5-5 in FIG. 4.

FIGS. 4 and 5 illustrate another example embodiment of a circuit assembly 300 of the present disclosure. The circuit assembly 300 includes two spaced apart circuit boards 302 and 304. Thermoelectric elements 306 are disposed between a portion of circuit board 302 and circuit board 304. Together, the portion of circuit board 302, the thermoelectric elements 306, and circuit board 304 define a TEM 310. A positive electrical pathway 312 and a negative electrical pathway (not visible) are formed along circuit board 302 to provide power to the TEM 310, and thereby define a TEM circuit generally on circuit board 302. In the illustrated embodiment the TEM 310 functions as a heat pump, with circuit board 302 operating as a cold side of the TEM 310 and circuit board 304 operating as a hot side of the TEM 310.

Circuit board 302 is larger in size than circuit board 304 such that the TEM 310 is located within a footprint defined by circuit board 302. This provides room to form the positive electrical pathway 312 and the negative electrical pathway 312 of the TEM circuit on circuit board 302 outside a footprint defined by the TEM 310 and circuit board 304. This also provides room to form additional electrical pathways 316a and 316b and to position additional electrical components 318, as desired, on circuit board 302 outside a footprint defined by the TEM 310 and circuit board 304.

Circuit board 302 is a one-sided circuit board. As such, the electrical pathways 316a and 316b (and the electrical components 318 associated therewith) are disposed on only one side of circuit board 302—an upper side portion (as viewed in FIG. 5). Similarly, electrically conductive patterns 320 for coupling the thermoelectric elements 306 of the TEM 310 to circuit board 302 (and for electrically coupling adjacent thermoelectric elements 306 together as part of the hot side of the TEM 310) are provided on only the upper side portion of circuit board 302 (such that the TEM 310 is ultimately located on the upper side portion of circuit board 302).

Circuit board 302 also has a layered structure that includes a base support 350 (e.g., a metal backing plate such as, for example, an aluminum plate, etc.), dielectric layers 324a and 324b, and the electrical pathways 316a and 316b and electrically conductive patterns 320 formed thereon. The base support 350 can provide mechanical support to circuit board 302 as well as thermally conductive properties, as desired. The dielectric layers 324a and 324b help electrically insulate circuit board 302, including its various electrical pathways 316a and 316b electrically conductive patterns 320, as well as the TEM 310. In the illustrated embodiment, electrical pathways 316a are located along an outer surface of circuit board 302, and electrical pathways 316b are buried in circuit board 302 between dielectric layers 324a and 324b. And, electrically conductive patterns 320 are generally buried in circuit board 302 below dielectric layer 324a. The buried electrical pathways 316a and 316b and the buried electrically conductive patterns 320 are formed by coupling a conductive layer to dielectric layer 324b (which is already positioned on the base support 350) and removing part of the conductive layer from the dielectric layer 324b in a desired pattern, thereby leaving the electrical pathways 316a and 316b and the electrically conductive patterns 320 on the dielectric layer 324b. The electrical pathways 316b are then formed by coupling dielectric layer 324a to circuit board 302 over the buried electrical pathways 316a and 316b and the buried electrically conductive patterns 320 (the dielectric layer 324a will fill in the areas where the prior conductive layer is removed), coupling another conductive layer to dielectric layer 324a, and removing part of the conductive layer from the dielectric layer 324a in a desired pattern, thereby leaving the electrical pathways 316b on the dielectric layer 324a.

Circuit board 304 is also a one-sided circuit board. Electrically conductive patterns 352 for coupling the thermoelectric elements 306 of the TEM 310 to circuit board 304 (and for electrically coupling adjacent thermoelectric elements 306 together as part of the hot side of the TEM 310) are formed on only one side of circuit board 304—an upper side portion (as viewed in FIG. 5). In addition, circuit board 304 has a layered structure that includes a base 328 and the electrically conductive patterns 352 which are formed thereon. The electrically conductive patterns 352 are formed by coupling an electrically conductive layer to the base 328 and then removing part of the electrically conductive layer from the base 328 in a desired pattern, leaving the electrically conductive patterns 352 on the base 328. As an example, the base 328 may include a solid dielectric layer. And as another example, the base 328 may include a dielectric layer supported on a thermally conductive support layer (with the electrically conductive patterns 352 then formed on the dielectric layer).

In the illustrated embodiment, the circuit assembly 300 is assembled generally as follows. The electrical pathways 316a and 316b and the electrically conductive patterns 320 are initially formed on circuit board 302. The TEM 310 is then formed as part of circuit board 302 by initially forming a half TEM module, and then coupling the half TEM module to circuit board 302. In particular, the half TEM module is initially formed by coupling the thermoelectric elements 306 to the electrically conductive patterns 352 formed on the base 328 of circuit board 304. The thermoelectric elements 306 of the half TEM module are then coupled to the electrically conductive patterns 320 formed on circuit board 302 to thereby form the TEM 310 (as an integral part of circuit board 302). Alternatively, the circuit assembly 300 could be assembled by known operations using, for example, automated surface mount technology, etc.

To accomplish this in the illustrated embodiment, a lower portion (as viewed in FIG. 5) of circuit board 302 is removed (generally under the electrically conductive patterns 320) for coupling the half TEM module to circuit board 302 (and thereby allowing the TEM 310 to be integrated into a desired circuit on circuit board 302). In particular, part of the base support 350 and dielectric layer 324b is removed at a location generally under the electrically conductive patterns 320 to thereby expose the electrically conductive patterns 320 from generally below circuit board 302. And, the half TEM module is then coupled to the electrically conductive patterns 320 to thereby form the TEM 310. As such, the TEM 310 is positioned generally within a lower side portion of circuit board 302, and (while not required, and depending on a desired thickness of the TEM 310) circuit board 304 is positioned in the illustrated embodiment generally flush with the lower side portion of circuit board 302. This orientation can allow a single heat sink (e.g., heat sink 336, etc.) to be used to cover (and cool) both the TEM 310 and the rest of circuit board 302. This orientation of the TEM 310 generally within a lower side portion of circuit board 302 can also allow for more effective temperature control operation of the TEM 310.

The electrical components 318 are coupled to circuit board 302 along desired electrical pathways 316a and 316b around the TEM 310 for operation (e.g., to provide power to the electrical components 318, etc.). In addition, an electrical component 326 (e.g., a heat-producing electrical component, etc.) is coupled to electrical pathway 316a' formed on the upper side surface of circuit board 302 as part of a circuit separate from (e.g., electrically independent from, etc.) the TEM circuit. At least one or more of the illustrated additional electrical components 318 may be configured to help control operation of the TEM 310 (as part of the TEM circuit). In addition, at least one or more of the illustrated additional electrical components 318 may be part of a circuit separate from (e.g., electrically independent from, etc.) the TEM circuit and may perform other desired operations (independent of the TEM circuit).

In operation, the TEM 310 functions to help control a temperature of electrical component 326 positioned on the electrical pathway 316a' of circuit board 302 by transferring heat from the electrical component 326 to circuit board 304 (via the Peltier effect). Circuit board 304 then operates as a heat spreader and a heat sink to help dissipate the transferred heat to surrounding air. In addition in the illustrated embodiment, a heat sink 336 is coupled to a lower side portion of the base 328 of circuit board 304 to further help dissipate the transferred heat away from circuit board 304 (and circuit assembly 300), to surrounding air. The heat sink 336 may be cooled by conventional convection and/or radiation techniques. And, a TIM may be used between circuit board 304 and the heat sink 336 to fill any gaps therebetween, in order to increase thermal transfer efficiency from circuit board 304 to the heat sink 336 (as compared to having the gaps filled with air, which is a relatively poor thermal conductor). In other example embodiments, heat transfer devices other than heat sinks may be used to help dissipate heat from circuit assemblies to surrounding air. And, in other example embodiments circuit boards may operate as the primary source of heat dissipation from circuit assemblies to surrounding air (such that secondary heat transfer devices (e.g., heat sinks, etc.) are not used or included).

It should be appreciated that in some areas in circuit board 302 the two dielectric layers 324a and 324b have no buried electrical pathways 312 or 316b therebetween (e.g., under electrical components 318, etc. Thermal conductivity of the dielectric layers 324a and 324b is not as good as that of the electrical pathways 312 and 316b. Therefore, thermal vias may be added to circuit board 302 to help improve heat transfer through the dielectric layers 324a and 324b. The thermal vias may be formed by making holes through the dielectric layers 324a and 324b, and filling the holes with metal (e.g., through a chemical deposition process, etc.). And as an example, the thermal vias may extend from the base support 350, through the dielectric layer 324b, and up to the dielectric layer 324a (or even partially into (but not through) the dielectric layer 324a), for example, under electrical components 318, etc.). The dielectric layer 324a is typically left substantially intact in order to electrically isolate the thermal vias from the surrounding environment as the metal in the thermal vias could conduct electricity as well as heat. Thermal vias are also described in co-owned U.S. patent application Ser. No. 12/560,194, filed Sep. 15, 2009, and titled "Thermoelectric Modules and Related Methods," the entire disclosure of which is incorporated herein by reference. It should also be appreciated that electrical vias could be added to circuit board 302 to help improve electrical conductivity through dielectric layers 324a and 324b as desired.

Figure 6:
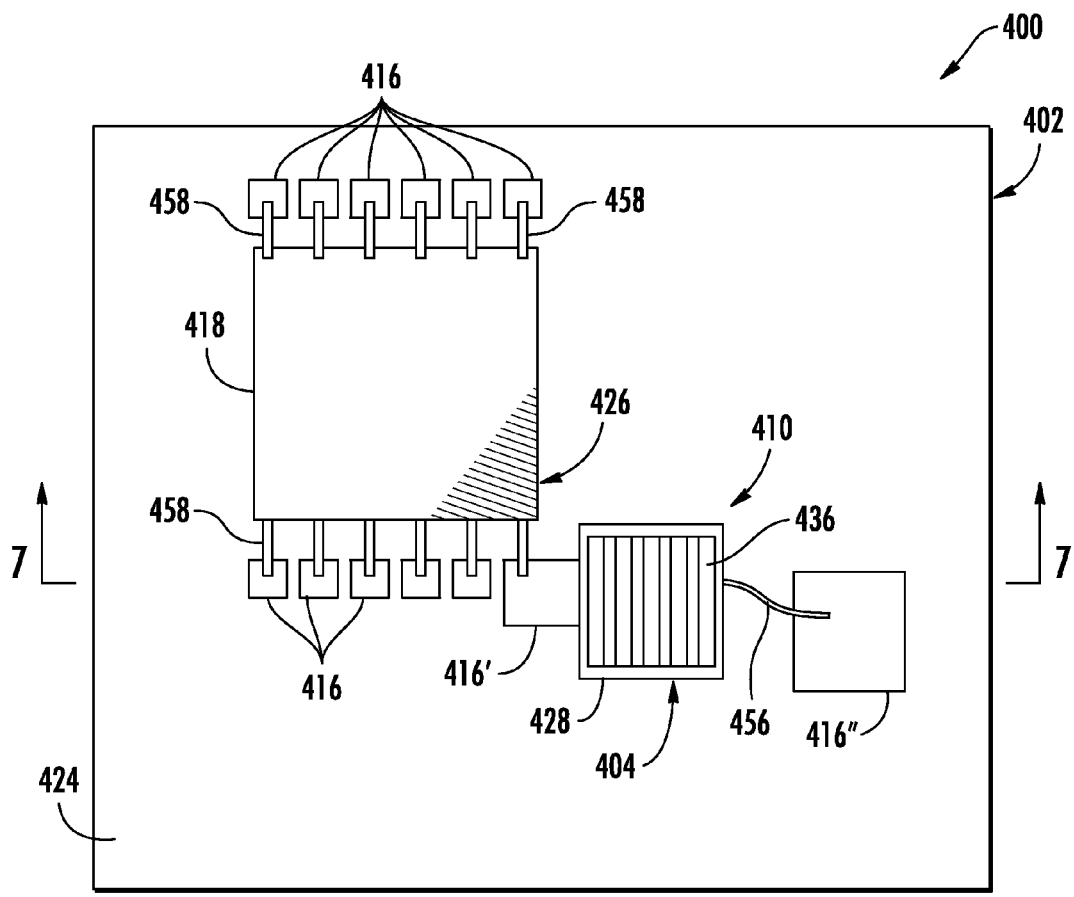
FIG. 6 is a top plan view of a circuit assembly according to yet another example embodiment of the present disclosure.
Figure 7:
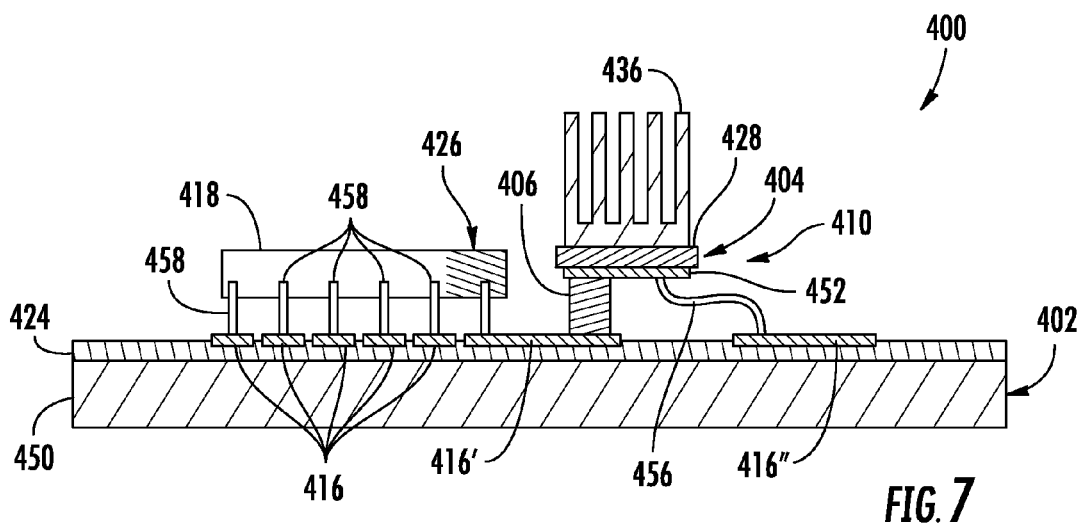
FIG. 7 is a section view of the circuit assembly of FIG. 6 taken in a plane including line 7-7 in FIG. 6.

FIGS. 6 and 7 illustrate another example embodiment of a circuit assembly 400 of the present disclosure. The circuit assembly 400 includes two spaced apart circuit boards 402 and 404. A thermoelectric element 406 (e.g., an N-type thermoelectric element, a P-type thermoelectric element, etc.) is disposed between a portion of circuit board 402 and circuit board 404. Together, the portion of circuit board 402, the thermoelectric element 406, and circuit board 404 define a TEM 410.

In the illustrated embodiment the TEM 410 functions as a heat pump, with circuit board 402 operating as a cold side of the TEM 410 and circuit board 404 operating as a hot side of the TEM 410. Here, the TEM 410 is arranged in series with an electrical component 418 (e.g., an integrated control package, etc.) located on circuit board 402 adjacent the TEM 410 to help transfer heat away from a hot portion 426 of the electrical component 418 as desired. A jumper wire 456 electrically connects the TEM 410 to circuit board 402 to complete a circuit including the TEM 410 and the electrical component 418 (which is necessary to accommodate the desired heat transfer from the electrical component 418 to the TEM 410).

Circuit board 402 is larger in size than circuit board 404 such that the TEM 410 is located within a footprint defined by circuit board 402. This provides room to form additional electrical pathways 416 and to position the electrical component 418, as desired, on circuit board 402 generally around the TEM 410 (and, for example, outside a footprint defined by the TEM 410 and circuit board 404).

Circuit board 402 is a one-sided circuit board. As such, the electrical pathways 416 and 416' (and the electrical component 418 associated therewith) and the electrical pathway 416" (for coupling the TEM 410 to circuit board 402) are disposed on only one side of circuit board 402—an upper side portion (as viewed in FIG. 7). Circuit board 402 has a layered structure that includes a base support 450 (e.g., an aluminum layer, etc.), a dielectric layer 424 formed on the base support 450, and the electrical pathways 416 formed on the dielectric layer 424. The electrical pathways are formed by coupling a conductive layer (e.g., a copper layer, etc.) to the dielectric layer 424 (which is already located on the base support 450) and removing part of the conductive layer from the dielectric layer 424 in a desired pattern. This leaves the desired electrical pathways 416 on the dielectric layer 424.

Circuit board 404 is also a one-sided circuit board. An electrically conductive pattern 452 for coupling the thermoelectric element 406 of the TEM 410 to circuit board 404 (as part of the hot side of the TEM 410) is formed on only one side of circuit board 404—a lower side portion (as viewed in FIG. 7). And, circuit board 404 has a layered structure that includes a base 428 and the electrically conductive pattern 452 formed on the base 428. Here, the electrically conductive pattern 452 is formed by removing part of a conductive layer (which is coupled to the base 428) from the base 428, thereby leaving the electrically conductive pattern 452 on the base 428. As an example, the base 428 may include a solid dielectric layer. And as another example, the base 428 may include a dielectric layer supported on a thermally conductive support layer (with the electrically conductive pattern 452 then formed on the dielectric layer).

In the illustrated embodiment, the circuit assembly 400 is assembled generally as follows. The electrical pathways 416 are initially formed on circuit board 402. The TEM 410 is then formed as part of circuit board 402 by initially forming a half TEM module, and then coupling the half TEM module to circuit board 402. In particular, the half TEM module is initially formed by coupling the thermoelectric element 406 to the electrically conductive pattern 452 formed on circuit board 404. The thermoelectric element 406 of the half TEM module is then coupled to the electrical pathway 416' formed on circuit board 402 to thereby form the TEM 410 (as an integral part of circuit board 402). Alternatively, the circuit assembly 400 could be assembled by known operations using, for example, automated surface mount technology, etc.

The electrical component 418 (via electrical connections 458) is coupled to circuit board 402 at desired electrical pathways 416 adjacent the TEM 410 for operation (e.g., to provide power to the electrical component 418, etc.). And, the jumper wire 456 of the TEM 410 is coupled to the electrical pathway 416" to thereby complete the circuit from the electrical component 418 through the TEM 410 and to circuit board 402. In the illustrated embodiment, the hot portion 426 of the electrical component 418 (e.g., a "hot spot" of the electrical component 418, etc.) generates more heat than the rest of the electrical component 418. As such, an electrical pathway 416' nearest the hot portion 426 is formed generally larger in size than the other corresponding electrical pathways 416, and is used to transport heat laterally within circuit board 402 away from the electrical component 418 to the TEM 410. At least one or more additional electrical components could be included in the circuit assembly 400 to help control operation of the TEM 410 and/or to perform other desired operations independent of the TEM 410.

In operation, the TEM 410 functions to help control a temperature of the hot spot of the electrical component 418 positioned on circuit board 402 by transferring heat from the hot spot to circuit board 404 (via the Peltier effect). Circuit board 404 then operates as a heat spreader and a heat sink to help dissipate the transferred heat to surrounding air. In addition in the illustrated embodiment, a heat sink 436 is coupled to an upper side portion of the base of circuit board 404 to further help dissipate the transferred heat away from circuit board 404 (and circuit assembly 400), to surrounding air. The heat sink 436 may be cooled by conventional convection and/or radiation techniques. And, a TIM may be used between circuit board 404 and the heat sink 436 to fill any gaps therebetween, in order to increase thermal transfer efficiency from circuit board 404 to the heat sink 436 (as compared to having the gaps filled with air, which is a relatively poor thermal conductor). In other example embodiments, heat transfer devices other than heat sinks may be used to help dissipate heat from circuit assemblies to surrounding air. And, in other example embodiments circuit boards may operate as the primary source of heat dissipation from circuit assemblies to surrounding air (such that secondary heat transfer devices (e.g., heat sinks, etc.) are not used or included).

In the illustrated embodiment, the electrical component 418 of the circuit assembly 400 may be configured to help control operation of the TEM 410. Or, the electrical component may be configured to perform other desired operations independent of the TEM circuit.

Figure 8:
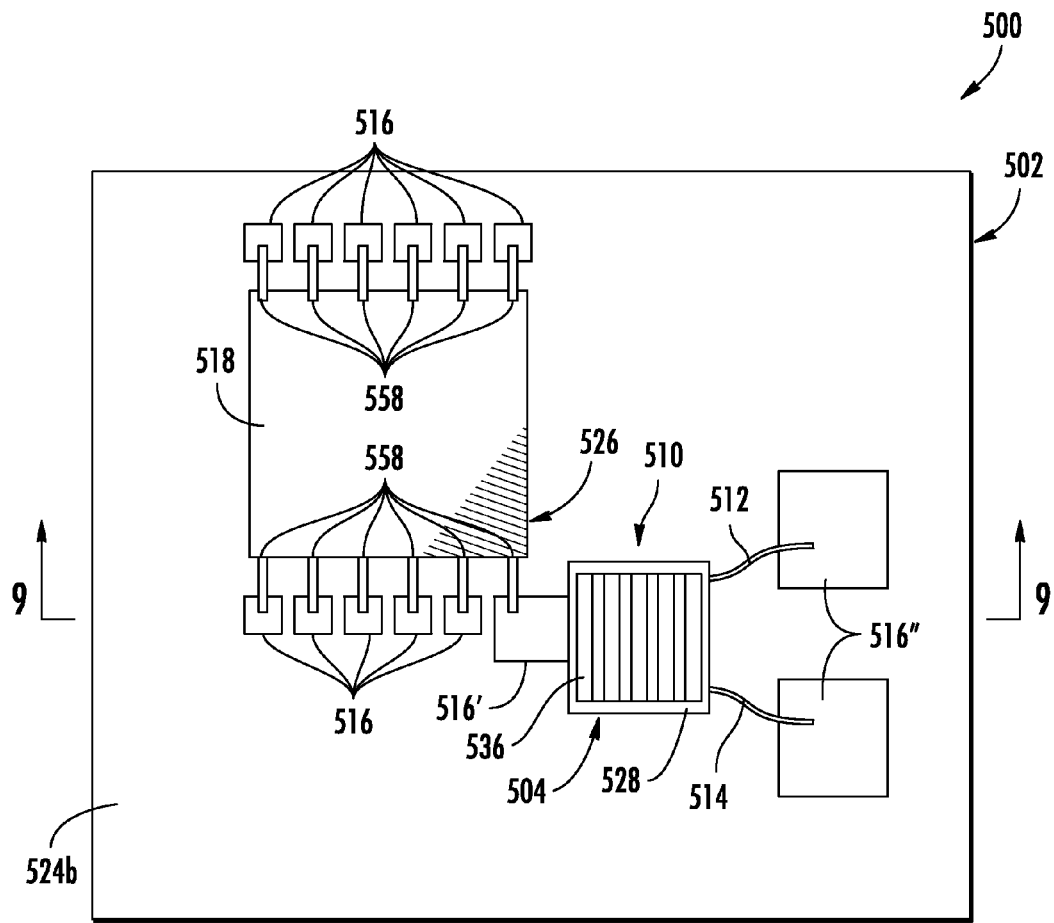
FIG. 8 is a top plan view of a circuit assembly according to still another example embodiment of the present disclosure.
Figure 9:
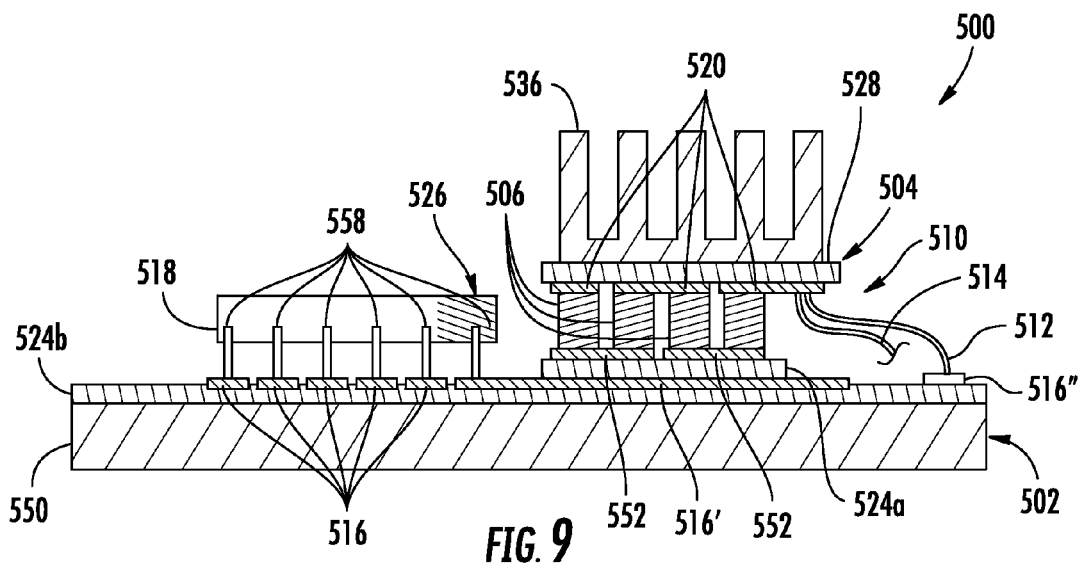
FIG. 9 is a section view of the circuit assembly of FIG. 8 taken in a plane including line 9-9 in FIG. 8.

FIGS. 8 and 9 illustrate another example embodiment of a circuit assembly 500 of the present disclosure. The circuit assembly 500 includes two spaced apart circuit boards 502 and 504. Thermoelectric elements 506 are disposed between a portion of circuit board 502 and circuit board 504. Together, the portion of circuit board 502, the thermoelectric elements 506, and circuit board 504 define a TEM 510. Lead wires 512 and 514 are provided to power the TEM 510, and thereby define a TEM circuit generally on circuit board 502. In the illustrated embodiment the TEM 510 functions as a heat pump, with circuit board 502 operating as a cold side of the TEM 510 and circuit board 504 operating as a hot side of the TEM 510. And in particular, the TEM 510 is configured to help transfer heat away from a hot portion 526 of an electrical component 518 coupled to circuit board 502.

Circuit board 502 is larger in size than circuit board 504 such that the TEM 510 is located within a footprint defined by circuit board 502. This provides room to form additional electrical pathways 516 and position electrical component 518 (e.g., an integrated control package, etc.), as desired, on circuit board 502 generally adjacent the TEM 510 (and, for example, outside a footprint defined by the TEM 510 and circuit board 504).

Circuit board 502 is a one-sided circuit board. As such, the electrical pathways 516 and 516' (and the electrical component associated therewith) and the electrical pathway 516" (for coupling the TEM 510 to circuit board 502) are disposed on only one side of circuit board 502—an upper side portion (as viewed in FIG. 9). Similarly, electrically conductive patterns 520 for coupling the thermoelectric elements 506 of the TEM 510 to circuit board 502 (and for electrically coupling adjacent thermoelectric elements 506 together as part of the hot side of the TEM 510) are provided on only the upper side portion of circuit board 502 (such that the TEM 510 is ultimately located on the upper side portion of circuit board 502).

Circuit board 502 has a layered structure that includes a base support 550 (e.g., a metal backing plate such as, for example, an aluminum plate, etc.), dielectric layers 524a and 524b, the electrical pathways 516 formed on dielectric layers 524a and 524b, and the electrically conductive patterns 520 formed on the dielectric layer 524a. In the illustrated embodiment, electrical pathways 516 are located along an outer surface of circuit board 502, with electrical pathway 516' partly buried in circuit board 502 between dielectric layers 524a and 524b. As such, the dielectric layer 524a helps electrically insulate the TEM 510 from the electrical pathway 516'. The electrical pathways 516 are formed by coupling a conductive layer to the dielectric layer 524b (which is already coupled to the base support 550) and removing part of the conductive layer from the dielectric layer in a desired pattern, thereby leaving the electrical pathways 516 on the dielectric layer 524b. The electrically conductive patterns 520 are then formed by coupling the dielectric layer 524a to circuit board 502 over part of the electrical pathway 516', coupling another conductive layer to the dielectric layer 524a, and then removing part of the conductive layer from the dielectric layer 524a in a desired pattern, leaving the electrically conductive patterns 520 on the dielectric layer 524a.

Circuit board 504 is also a one-sided circuit board. Electrically conductive patterns 552 for coupling the thermoelectric elements 506 of the TEM 510 to circuit board 504 (and for electrically coupling adjacent thermoelectric elements 506 together as part of the hot side of the TEM 510) are formed on only one side of circuit board 504—a lower side portion (as viewed in FIG. 9). In addition, circuit board 504 has a layered structure that includes a base 528 and the electrically conductive patterns 552 which are formed thereon. The electrically conductive patterns 552 are formed by coupling an electrically conductive layer to the base 528 and then removing part of the electrically conductive layer from the base 528 in a desired pattern, thereby leaving the electrically conductive patterns 552 on the base 528. As an example, the base 528 may include a solid dielectric layer. And as another example, the base 528 may include a dielectric layer supported on a thermally conductive support layer (with the electrically conductive patterns 552 then formed on the dielectric layer).

In the illustrated embodiment, the circuit assembly 500 is assembled generally as follows. The electrical pathways 516 and the electrically conductive patterns 520 are initially formed on circuit board 502. The TEM 510 is then formed as part of circuit board 502 by initially forming a half TEM module, and then coupling the half TEM module to circuit board 502. In particular, the half TEM module is initially formed by coupling the thermoelectric elements 506 to the electrically conductive patterns 552 formed on circuit board 504. The thermoelectric elements 506 of the half TEM module are then coupled to the corresponding electrically conductive patterns 520 formed on circuit board 502 to thereby form the TEM 510 (as an integral part of circuit board 502). Alternatively, the circuit assembly 500 could be assembled by known operations using, for example, automated surface mount technology, etc.

The electrical component 518 (via electrical connections 558) is coupled to circuit board 502 at desired electrical pathways 516 and 516' adjacent the TEM 510 for operation (e.g., to provide power to the electrical component 518, etc.). And, the lead wires 512 and 514 of the TEM 510 are coupled to the electrical pathway 516". In the illustrated embodiment, the hot portion 526 of the electrical component 518 (e.g., a "hot spot" of the electrical component 518, etc.) generates more heat than the rest of the electrical component 518. As such, an electrical pathway 516' nearest the hot portion 526 is formed generally larger in size than the other corresponding electrical pathways 516, and is used to transport heat laterally within circuit board 502 away from the electrical component 518 to the TEM 510. Here, the TEM 510 is not electrically connected to the electrical component 518. Instead, the layered structure of circuit board 502 (and particularly dielectric layer 524a) electrically isolates the TEM 510 from the electrical component 518, but still allows heat transfer from the electrical pathway 516' to the TEM 510 for cooling operation.

In operation, the TEM 510 functions to help control a temperature of the hot spot of the electrical component 518 positioned on circuit board 502 by transferring heat from the hot spot to circuit board 504 (via the Peltier effect). Circuit board 504 then operates as a heat spreader and a heat sink to help dissipate the transferred heat to surrounding air. In addition in the illustrated embodiment, a heat sink 536 is coupled to an upper side portion of the base 528 of circuit board 504 to further help dissipate the transferred heat away from circuit board 504 (and circuit assembly 500), to surrounding air. The heat sink 536 may be cooled by conventional convection and/or radiation techniques. And, a thermal interface material (TIM) may be used between circuit board 504 and the heat sink 536 to fill any gaps therebetween, in order to increase thermal transfer efficiency from circuit board 504 to the heat sink 536 (as compared to having the gaps filled with air, which is a relatively poor thermal conductor). In other example embodiments, heat transfer devices other than heat sinks may be used to help dissipate heat from circuit assemblies to surrounding air. And, in other example embodiments circuit boards may operate as the primary source of heat dissipation from circuit assemblies to surrounding air (such that secondary heat transfer devices (e.g., heat sinks, etc.) are not used or included).

Figure 10:
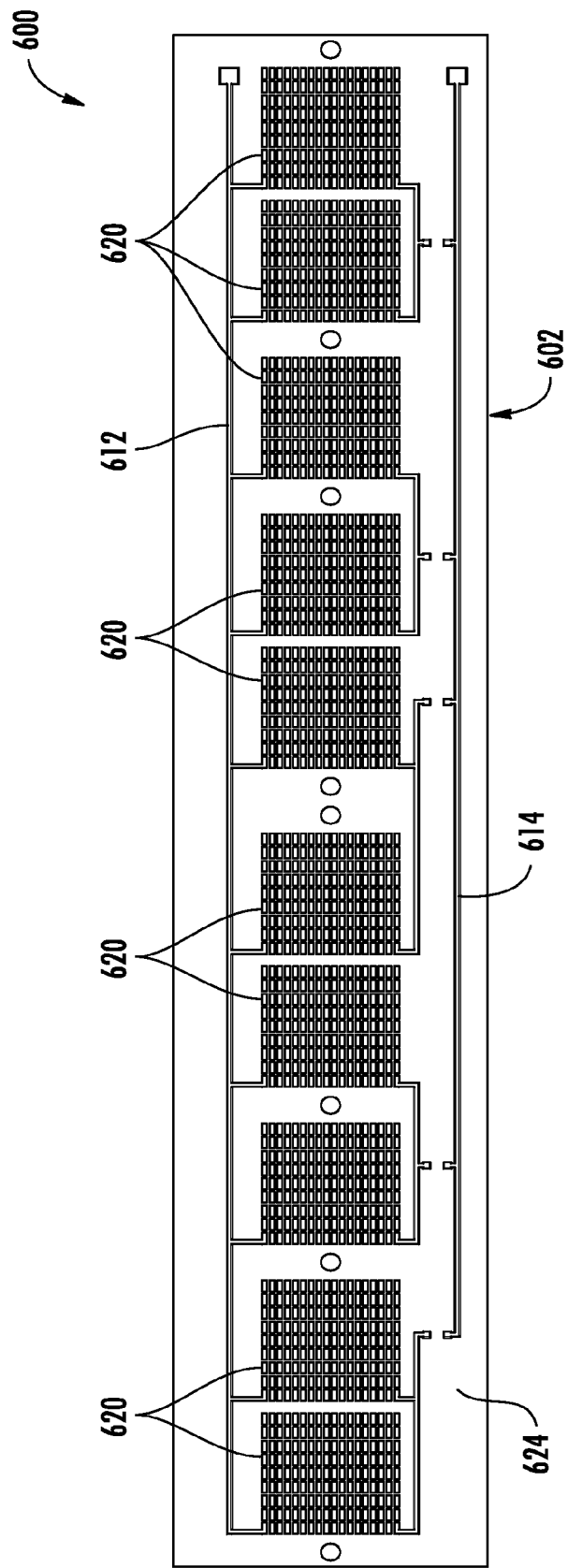
FIG. 10 is a top plan view of a circuit assembly according to another example embodiment of the present disclosure.

FIG. 10 illustrates another example embodiment of a circuit assembly 600 of the present disclosure. The illustrated circuit assembly 600 includes a circuit board 602 and a series of ten groups of electrically conductive patterns (each indicated at reference number 620) formed on an upper side portion of circuit board 602 (as viewed in FIG. 10). As in prior example embodiments, the electrically conductive patterns 620 of each group are configured to couple thermoelectric elements of a TEM (of a half TEM module comprising the thermoelectric elements coupled to a second circuit board) to circuit board 602 and to electrically couple adjacent thermoelectric elements together. As such, circuit board 602 is configured to accommodate (and form a part of) ten different TEMs (one at each group of electrically conductive patterns 620). A positive electrical pathway 612 and a negative electrical pathway 614 are formed along circuit board 602 to provide power to each TEM, and thereby define a TEM circuit generally on circuit board 602. In the illustrated embodiment each TEM formed as part of circuit board 602 can function as a heat pump, with circuit board 602 operating as a hot side of each TEM and a second circuit board (not shown) of each TEM operating as a cold side of the respective TEM.

Circuit board 602 is larger in size than each group of the electrically conductive patterns 620 formed on circuit board 602 such that each group of the electrically conductive patterns 620 is located within a footprint defined by circuit board 602. This provides room to form the positive electrical pathway 612 and the negative electrical pathway 614 of the TEM circuit on circuit board 602 adjacent the electrically conductive patterns 620. This also provides room to form additional electrical pathways and position additional electrical components, as desired, on circuit board 602 generally around the electrically conductive patterns 620 (and, for example, outside a footprint defined by each of the electrically conductive patterns 620 and TEM ultimately associated therewith). For example, at least one or more additional electrical components may added to circuit board 602 to help control operation of the TEMs (as part of the TEM circuit) and/or as part of a circuit separate from the TEM circuit to thereby perform other desired operations independent of the TEM circuit.

In the illustrated embodiment, the electrically conductive patterns 620 and the positive and negative electrical pathways 612 and 614 of circuit board 602 are formed on an upper side portion of a base 624 of circuit board 602. To accomplish this, a conductive layer of material is initially coupled to the base 624. And, part of the conductive layer is then removed in desired patterns 620 to form the various electrically conductive patterns 620 and the positive and negative electrical pathways 612 and 614. As an example, the base 624 may include a solid dielectric layer. And as another example, the base 624 may include a dielectric layer supported on a thermally conductive support layer (with the patterns 620 and the positive and negative electrical pathways 612 and 614 then formed on the dielectric layer).

Also in the illustrated embodiment, each TEM that is to be formed as part of circuit board 602 is initially constructed as a half TEM module, and then coupled to a respective one of the electrically conductive patterns 620 of circuit board 602. In particular, each half TEM module is initially formed by coupling thermoelectric elements (not shown) to electrically conductive patterns formed on a circuit board (not shown). The thermoelectric elements of each half TEM module are then coupled to a corresponding group of electrically conductive patterns 620 formed on circuit board 602 to thereby form each TEM as an integral part of circuit board 602. Circuit assembly 600, with the multiple TEMs included therein, could, for example, thus resemble multiple ones of the circuit assembly 600 extending end to end.

In operation, the multiple TEMs ultimately formed as part of circuit board 602 can be used to help control a temperature of circuit assembly 600 (e.g., a component thereof, etc.) and/or of an environment surrounding circuit assembly 600 by, for example, transferring heat from one end portion of the circuit assembly 600 to an opposite end portion of the circuit assembly 600.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "formed on," "engaged to," "connected to," or "coupled to" another element or layer, it may be directly on, formed on, engaged, connected or coupled to the other element or layer, or intervening elements or layers may be present. In contrast, when an element is referred to as being "directly on," "directly formed on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A circuit assembly comprising:
a circuit board;
a thermoelectric module; and
at least one electrical pathway coupling the thermoelectric module to the circuit board for use as a heat pump in the circuit assembly;
wherein the circuit board forms at least part of the thermoelectric module; and
wherein the circuit board can support electrical components on the circuit board at locations spaced apart from the thermoelectric module;
the circuit assembly further comprising multiple thermoelectric modules, and wherein the circuit board forms at least part of the multiple thermoelectric modules.

2. The circuit assembly of claim 1, wherein the circuit board operates as one of a hot side and a cold side of the thermoelectric module.

3. A circuit assembly comprising:
a circuit board;
a thermoelectric module;
at least one electrical pathway coupling the thermoelectric module to the circuit board for use as a heat pump in the circuit assembly;
wherein the circuit board forms at least part of the thermoelectric module;
wherein the circuit board can support electrical components on the circuit board at locations spaced apart from the thermoelectric module;
wherein the thermoelectric module includes:
a substrate spaced apart from the circuit board; and
multiple N-type thermoelectric elements and multiple P-type thermoelectric elements electrically coupled between the substrate and the circuit board.

4. The circuit assembly of claim 3, wherein the thermoelectric module is configured to transfer heat away from at least one of the electrical components through the circuit board when said at least one of the electrical components is coupled to the circuit board.

5. The circuit assembly of claim 3, further comprising at least one electrical component coupled to the substrate of the thermoelectric module, the thermoelectric module being configured to transfer heat away from said at least one electrical component.

6. The circuit assembly of claim 3, wherein at least one of the electrical components is coupled to the circuit board and spaced apart from the thermoelectric module, the thermoelectric module being configured to transfer heat away from said at least one of the electrical components.

7. The circuit assembly of claim 1, wherein the thermoelectric module is disposed within a footprint of the circuit board, the circuit board being configured to support the electrical components within said footprint of the circuit board at locations spaced apart from the thermoelectric module.

8. The circuit assembly of claim 1, wherein the electrical components comprise at least one electrical component configured to control operation of the thermoelectric module, the at least one electrical component being disposed on the circuit board in a position spaced apart from the thermoelectric module.

9. The circuit assembly of claim 1, further comprising a heat transfer device coupled to the circuit board.

10. The circuit assembly of claim 3, further comprising multiple thermoelectric modules, and wherein the circuit board forms at least part of the multiple thermoelectric modules.

11. The circuit assembly of claim 1, wherein the at least one electrical pathway is on an exposed surface of the circuit board or is buried in the circuit board.

12. A circuit assembly comprising:
a circuit board;
a thermoelectric module; and
at least one electrical pathway coupling the thermoelectric module to the circuit board for use as a heat pump in the circuit assembly;
wherein the circuit board forms at least part of the thermoelectric module;
wherein the circuit board can support electrical components on the circuit board at locations spaced apart from the thermoelectric module;
wherein the at least one electrical pathway comprises multiple groups of electrical pathways on the circuit board, each group configured to couple a different thermoelectric module to the circuit board.

13. A circuit assembly comprising:
a circuit board;
a thermoelectric module; and
at least one electrical pathway coupling the thermoelectric module to the circuit board for use as a heat pump in the circuit assembly;
wherein the circuit board forms at least part of the thermoelectric module;
wherein the circuit board can support electrical components on the circuit board at locations spaced apart from the thermoelectric module;
wherein the at least one electrical pathway is buried in the circuit board, and wherein the circuit board includes a base support, at least part of the base support being removed to thereby define an opening through the base support exposing the at least one electrical pathway of the circuit board, the at least one electrical pathway being configured to couple the thermoelectric module to the circuit board through the opening defined in the base support of the circuit board.

14. The circuit assembly of claim 1, wherein the at least one electrical pathway is disposed between two dielectric layers of the circuit board.

15. A circuit assembly comprising:
a circuit board;
a thermoelectric module comprising:
a first substrate defined by a portion of the circuit board;
a second substrate disposed within a footprint of the circuit board;

N-type and P-type thermoelectric elements disposed generally between the first and second substrates;

whereby the thermoelectric module is operable as a heat pump;

at least one additional thermoelectric module coupled to the circuit board such that the circuit board defines part of the at least one additional thermoelectric module;

wherein the circuit board can support at least one electrical component in a position spaced apart from the thermoelectric module.

16. The circuit assembly of claim 15, wherein the thermoelectric module is configured to transfer heat away from the at least one electrical component coupled to the second substrate.

17. The circuit assembly of claim 15, further comprising at least one electrical component configured to control operation of the thermoelectric module, wherein the at least one electrical component is disposed on the circuit board in a position spaced apart from the thermoelectric module.

18. The circuit assembly of claim 15, wherein the thermoelectric module is configured to transfer heat away from the at least one electrical component when said at least one electrical component is coupled to the circuit board.

19. A circuit assembly comprising:
a circuit board;
a thermoelectric module comprising:
  a first substrate defined by a portion of the circuit board;
  a second substrate disposed within a footprint of the circuit board;
  N-type and P-type thermoelectric elements disposed generally between the first and second substrates;
  whereby the thermoelectric module is operable as a heat pump;
electrical pathways configured to couple the thermoelectric elements to the circuit board, the electrical pathways being buried in the circuit board;
wherein the circuit board can support at least one electrical component in a position spaced apart from the thermoelectric module;
wherein the circuit board includes a base support, at least part of the base support being removed to thereby define an opening through the base support exposing the electrical pathways, the electrical pathways being configured to couple the thermoelectric elements to the circuit board through the opening defined in the base support of the circuit board.

20. A method of making a circuit assembly having a circuit and a thermoelectric module incorporated therein, the method comprising:
forming at least one electrical pathway on a circuit board as part of the circuit for electrically coupling an electrical component of the circuit to the circuit board; and
coupling multiple N-type thermoelectric elements and multiple P-type thermoelectric elements between part of the circuit board and a substrate, thereby forming a thermoelectric module on the circuit board such that the circuit board defines part of the thermoelectric module;
wherein the substrate defines a footprint that is smaller than a footprint of the circuit board, and wherein the circuit board can support additional electrical components of the circuit on the circuit board in a position outside the footprint defined by the substrate.

21. The method of claim 20, further comprising coupling an electrical component of the circuit to the circuit board via the at least one electrical pathway formed on the circuit board.

22. The method of claim 20, further comprising forming at least one electrical pathway on the substrate, and coupling an electrical component to the substrate via said electrical pathway formed on the substrate.

23. The method of claim 20, further comprising coupling a heat transfer device to at least one of the circuit board and the substrate.

24. A circuit assembly comprising:
a circuit board comprising electrically conductive patterns and at least one electrical pathway;
a substrate comprising electrically conductive patterns; and
multiple N-type thermoelectric elements and multiple P-type thermoelectric elements disposed between the circuit board and the substrate and coupled to the electrically conductive patterns of the circuit board and the electrically conductive patterns of the substrate;
wherein a portion of the circuit board comprising the electrically conductive patterns, the substrate, and the multiple N-type and P-type thermoelectric elements define a thermoelectric module on the circuit board, such that the circuit board forms an integral part of the thermoelectric module;
wherein the at least one electrical pathway of the circuit board is coupled to the thermoelectric module for providing power to the thermoelectric module; and
wherein the circuit board can support at least one electrical component on the circuit board at a location spaced apart from the thermoelectric module;
whereby the thermoelectric module is operable as a heat pump.

25. The circuit assembly of claim 24, further comprising the at least one electrical component, wherein the at least one electrical component is coupled to the circuit board and is configured to control operation of the thermoelectric module, the at least one electrical component being disposed on the circuit board in a position spaced apart from the thermoelectric module.

26. The circuit assembly of claim 24, further comprising at least one electrical component coupled to the substrate, the thermoelectric module being configured to transfer heat away from said at least one electrical component.

* * * * *